United States Patent
Meynants (10) Patent No.: US 11,152,411 B2
(45) Date of Patent: Oct. 19, 2021

(54) RESONANT CAVITY ENHANCED IMAGE SENSOR

(71) Applicant: ams AG, Premstaetten (AT)

(72) Inventor: Guy Meynants, Retie (BE)

(73) Assignee: AMS AG, Premstaetten (AT)

( * ) Notice: Subject to any disclaimer, the term of this patent is extended or adjusted under 35 U.S.C. 154(b) by 22 days.

(21) Appl. No.: 16/617,806

(22) PCT Filed: May 24, 2018

(86) PCT No.: PCT/EP2018/063710
§ 371 (c)(1),
(2) Date: Nov. 27, 2019

(87) PCT Pub. No.: WO2018/219786
PCT Pub. Date: Dec. 6, 2018

(65) Prior Publication Data
US 2020/0194474 A1    Jun. 18, 2020

(30) Foreign Application Priority Data

Jun. 2, 2017 (EP) .................................... 17174298
Jun. 29, 2017 (EP) .................................... 17178777

(51) Int. Cl.
*H01L 27/146* (2006.01)

(52) U.S. Cl.
CPC .... *H01L 27/1462* (2013.01); *H01L 27/14629* (2013.01); *H01L 27/14636* (2013.01); *H01L 27/14649* (2013.01); *H01L 27/14685* (2013.01); *H01L 27/1464* (2013.01)

(58) Field of Classification Search
CPC ........... H01L 27/1462; H01L 27/14629; H01L 27/14636; H01L 27/14649; H01L 27/14685; H01L 27/1464; H01L 27/14665; H01L 27/14643
See application file for complete search history.

(56) References Cited

U.S. PATENT DOCUMENTS

| | | | |
|---|---|---|---|
| 5,525,828 A | 6/1996 | Bassous et al. | |
| 7,279,764 B2 * | 10/2007 | Mouli | H01L 27/14609 257/436 |
| 8,283,195 B2 | 10/2012 | Meynants | |
| 9,035,309 B2 * | 5/2015 | Park | H01L 27/14687 257/59 |
| 2005/0040445 A1 | 2/2005 | Mouli | |

(Continued)

FOREIGN PATENT DOCUMENTS

EP      3607738 A1    2/2020

OTHER PUBLICATIONS

European Patent Office, International Search Report for PCT/EP2018/063710 dated Jul. 25, 2018.

Barrow, L. et al.: "A QuantumFilm Based QuadVGA 1.5 µm Pixel Image Sensor with Over 40% QE at 940 nm for Actively Illuminated Applications" proc. IISW 2017, Hiroshima, Jun. 2017, www.imagesensors.org.

(Continued)

*Primary Examiner* — Victor A Mandala
(74) *Attorney, Agent, or Firm* — MH2 Technology Law Group LLP (57) ABSTRACT

The semiconductor image sensor device comprises a semiconductor layer having a main surface and an opposite rear surface, and a charge carrier generating component at the main surface. The charge carrier generating component is arranged between a top reflecting layer and a bottom reflecting layer, which are arranged outside the semiconductor layer.

14 Claims, 10 Drawing Sheets

(56) References Cited

U.S. PATENT DOCUMENTS

| | | |
|---|---|---|
| 2005/0205930 A1 | 9/2005 | Williams, Jr. |
| 2005/0274988 A1 | 12/2005 | Hong |
| 2009/0152664 A1 | 6/2009 | Klem et al. |
| 2011/0193940 A1* | 8/2011 | Park .................. H01L 27/14687 348/46 |
| 2012/0050554 A1* | 3/2012 | Levine .................... H04N 5/374 348/216.1 |
| 2012/0313204 A1 | 12/2012 | Haddad et al. |
| 2014/0159183 A1 | 6/2014 | Na |
| 2015/0349187 A1* | 12/2015 | Taylor ..................... G02B 6/00 385/14 |
| 2017/0186796 A1* | 6/2017 | Kao .................. H01L 27/14685 |
| 2017/0236854 A1* | 8/2017 | Lee .................... H01L 27/1464 257/432 |
| 2017/0345958 A1* | 11/2017 | Meyer ............... H01L 31/03046 |
| 2018/0247968 A1* | 8/2018 | Na ........................ G01S 7/4914 |
| 2019/0081094 A1* | 3/2019 | Kato ................... H01L 27/1464 |

OTHER PUBLICATIONS

Emsley, M. K. et. al.: "High-Speed Resonant-Cavity-Enhanced Silicon Photodetectors on Reflecting Silicon-On-Insulator Substrates" IEEE Photonics Technology Letters, vol. 14, No. 4, Apr. 2002, pp. 519-521.

Kishino, K. et. al.: "Resonant Cavity-Enhanced (RCE) Photodetectors" IEEE Journal of Quantum Electronics. Vol. 27, No. 8, Aug. 1991, pp. 2025-2033.

Meynants, G. et al.: "Emission Microscopy analysis of hot cluster defects of imagers processed on SOI" proc. International Image Sensor Workshop, Snowbird, Jun. 2013, available on www.imagesensors.org.

European Office Action in corresponding European Application No. 17178777.3 dated Feb. 9, 2021, 8 pages.

* cited by examiner

| λ1 | λ2 | λ3 | λ1 | λ2 | λ3 |
|----|----|----|----|----|----|
| λ2 | λ3 | λ1 | λ2 | λ3 | λ1 |
| λ3 | λ1 | λ2 | λ3 | λ1 | λ2 |
| λ1 | λ2 | λ3 | λ1 | λ2 | λ3 |
| λ2 | λ3 | λ1 | λ2 | λ3 | λ1 |
| λ3 | λ1 | λ2 | λ3 | λ1 | λ2 |

RESONANT CAVITY ENHANCED IMAGE SENSOR

BACKGROUND OF THE INVENTION

This disclosure concerns the field of image sensors, in particular image sensors to be optimized for a good quantum efficiency at a specific wavelength. Such image sensors are used, for example, in systems where artificial light is projected, like a camera system using a structured light pattern for 3D imaging or a system using a set of short light pulses such as used in time-of-flight 3D imaging systems. Such systems often use narrowband near infrared light because near infrared light is not visible to the user. Near infrared light is difficult to detect with silicon photodiodes as commonly used in CMOS and CCD image sensors. But particular bands in the infrared region are interesting because of their low sunlight content, e.g. the $H_2O$ absorption band around 940 nm, which means that there is significantly less background signal in an actively illuminated system. It is then advantageous to use a narrowband 940 nm light source so that the amount of background signal from sunlight illumination is minimized. Light sources like vertical-cavity surface-emitting lasers (VCSELs) or LEDs are commonly used. But it is important that the image sensor achieves a sufficient quantum efficiency at this wavelength.

Other applications where image sensors need to be selective to a specific wavelength are photoluminescence imaging or 2D spectroscopy. The present disclosure can also be used in this field. In photoluminescence a light source or xray source triggers photoluminescence in a scintillating or photoluminescent material. This photoluminescence occurs at a specific wavelength, and the illuminated pattern is recorded by the image sensor. This image sensor must only be sensitive to the wavelength of the photoluminescent light. In 2D spectroscopy, different pixels may be selectively sensitive to specific wavelengths, which can be realized by certain embodiments of the current disclosure.

The wavelength(s) for which the image sensors are optimized in this disclosure can be located in any wavelength band where the used detector material is light sensitive. If silicon is used, this includes visible and near-infrared light. For near-infrared light the disclosure offers an additional advantage that the detector can remain thin.

Photons have a certain absorption depth in the photodetector, which depends on the bandgap of the photodetector and the energy, hence wavelength, of the photon. For silicon, which is commonly used for CMOS and CCD image sensors, the absorption depth at 940 nm is 55 μm. This mean that a photodetector for 940 nm would require at least 55 μm to detect at max. 63% (1−1/e) of the photons, as an upper limit without any other losses due to reflection or recombination. Hence a thick layer is required to collect sufficient photons with a sufficiently large quantum efficiency.

A thick detector layer is not feasible in an array of small pixels each containing a photodiode, because crosstalk between pixels caused by carrier diffusion would limit the sharpness of the image. The thickness of the charge collecting layer is typically less than twice the pixel pitch. For small pixels having a dimension of 1.4 μm or less, additional isolation techniques are employed to avoid carrier diffusion, such as deep implants or deep isolation trenches. To increase the thickness without too much crosstalk, a vertical electric field must be used, by using a backside bias technique or by a change in impurity concentration in the layer. Such techniques are typically only used for larger pixels, for example with 10 micron pixel pitch. Such backside bias technique also requires additional process steps in manufacturing, increasing cost of the device.

Furthermore, at wavelengths where the photon energy is not much larger than the bandgap of the semiconductor detector layer, the charge carrier collection depth significantly depends on temperature. Thicker detector layers also limit the maximum speed at which charge carriers can be collected. This is important in fast gating pixels, such as for example used in indirect time-of-flight image sensors.

A Fabry-Pérot interferometer or etalon is formed by two reflecting mirrors placed at a specified distance. In case when the optical path length between the mirrors is a multiple of the wavelength of the light in the material inside the cavity, a constructive interference occurs. Structures having a photon absorbing layer placed in between the two reflecting mirrors have been described to build large discrete photodiodes, mainly intended for fast collection of carriers. Similar structures are used in vertical-cavity surface-emitting lasers (VCSELs).

N. Tack et al., "A Compact High Speed and Low Cost Hyperspectral Imager", proc. SPIE Vol. 8266, 2012, describe hyperspectral and multispectral sensors using Fabri-Pérot interferometers on top of the pixels. K. Kishino et al, "Resonant Cavity-Enhanced (RCE) Photodetectors", IEEE journal of Quantum Electronics, Vol. 27, No. 8, August 1991, analytically describe the characteristics of a photodetector structure located between two mirrors, including quantum efficiency, wavelength selectivity, angular sensitivity and carrier collection speed. Kishino et al. also show characteristics for an AlGaAs—GaAs heterojunction phototransistor with an InGaAs collector layer, and applications in spectral de-multiplexing of optical fibre signals for telecommunication applications.

M. Emsley, et al, "High-Speed Resonant-Cavity-Enhanced Silicon Photodetectors on Reflecting Silicon-On-Insulator Substrates", IEEE Photonics Technology Letters, Vol. 14, No. 4, April 2002, describe a structure implemented in CMOS, using a $SiO_2$—Si—$SiO_2$ bottom reflector and the Si/air interface as the top reflector, on a large photodiode with a thickness of 2.1 μm. The detector is manufactured using a silicon-on-insulator (SOI) technique. The bottom reflector is constructed in the SOI material on which an epitaxial layer is grown. The photodiode structure is processed on top of the SOI layer inside this epitaxial layer.

US 2005/0263805 A1 discloses an imager with pixels having a resonant-cavity photodiode, which increases absorption of light having long wavelengths. A trench is formed for the photodiode and a reflective film is grown on the bottom of the trench. The reflective film reflects light that is not initially absorbed back to the active region of the photodiode. The trench is filled with photodetector material. US 2009/0152664 A1 discloses a photodetector comprising an integrated circuit, a first optically sensitive layer between two electrodes over at least a portion of the integrated circuit, and a second optically sensitive layer between two electrodes over the first optically sensitive layer. A bias is selectively applied to the electrodes, and signals related to the number of photons received by the respective optically sensitive layer are read.

SUMMARY OF THE INVENTION

The resonant cavity enhanced image sensor makes use of a resonating optical cavity. It provides high quantum efficiency and a reduced depth of the region where charge carriers are generated and detected. This image sensor can be realized as a CMOS image sensor and applied in conjunction with infrared light sources, which may be tuned typically to a wavelength of 940 nm, for example. The concept can also be employed to CCDs (charge-coupled devices).

The image sensor can comprise thin absorbing silicon layers. All charge carriers can rapidly be collected by an appropriate charge collection bin, which may include a photodiode, for instance. Since the charge carriers are essentially generated in the depletion area of the photodiode, the carrier collection process can be very fast. The image sensor allows to design especially small pixels.

The resonant cavity enhanced image sensor comprises two reflective mirrors placed on top and at the bottom of the active layer of the image sensor. Three main structures are proposed, one for back-illuminated image sensors, one for front-illuminated image sensors and one where the cavity including the photodetecting layer and both reflecting layers is located at a surface above a readout IC. A top reflecting layer is arranged on the side of the cavity facing the incident radiation, and a bottom reflecting layer is arranged on the side of the cavity that is remote from the incident radiation.

The mirrors may especially be arranged on different levels in the dielectric stack between the metal layers of a wiring, as will be further discussed. The mirrors can especially be dielectric mirrors (Bragg mirrors, for example) tuned for optimized reflectance at the target wavelength.

The cavity created between the two mirrors resonates at a certain wavelength. Constructive interference will occur when the wavelength is an integer multiple of the optical path length between the mirrors. The resonating wavelength depends on the angle-of-incidence of the incoming light. For a simple structure with only one material between the mirrors, the interference can in first order be described by the following equation:

$$k\lambda = 2n \cdot d \cdot \cos(\varphi)$$

(with k=wavenumber; λ=wavelength; φ=angle of incidence; d=thickness of the intermediate layer between the mirrors; and n=refractive index of the intermediate layer)

In different embodiments different materials may be arranged between the mirrors. Nevertheless, a resonance at the target wavelength can be created by correct tuning of the thickness of this layer stack.

The semiconductor image sensor device comprises a semiconductor layer having a main surface and an opposite rear surface, and a charge carrier generating component, which is sensitive to radiation, arranged at the main surface. The charge carrier generating component is arranged between a top reflecting layer and a bottom reflecting layer, which are arranged outside the semiconductor layer.

The top reflecting layer may be provided for incidence of radiation. The top reflecting layer can be arranged above the main surface and the bottom reflecting layer above the rear surface, or vice versa.

The top reflecting layer and the bottom reflecting layer are appropriate to form opposite boundaries of a resonant cavity, which may especially be tuned to a wavelength of infrared radiation. The resonant cavity may in particular be tuned to a wavelength within the range from 900 nm to 980 nm.

Embodiments of the semiconductor image sensor device may further comprise a photodiode forming the charge carrier generating component. A region of a first conductivity type is arranged in the semiconductor layer at the main surface, and a region of a second conductivity type, which is opposite to the first conductivity type, is contiguous with the region of the first conductivity type, thus forming the photodiode.

The region of the first conductivity type may be embedded in the region of the second conductivity type, for example. A sense node is present at or near the main surface, and a transfer gate is arranged at the main surface between the photodiode and the sense node. The photodiode may be a buried or pinned photodiode, where the surfaces of the semiconductor layer are passivated by highly doped layers of majority type implants (e.g. p++ pinning layers). Instead of a photodiode, a buried or surface photogate may be used to collect the photocarriers, such as used in some CCD architectures.

Further embodiments comprise a dielectric layer on or above the main surface. The dielectric layer can be arranged between the semiconductor layer and the top reflecting layer or between the semiconductor layer and the bottom reflecting layer. The top reflecting layer is provided for incidence of radiation.

In further embodiments, one of the top reflecting layer and the bottom reflecting layer is embedded in the dielectric layer. Metallization layers, in particular metal layers of a wiring, may be embedded in the dielectric layer, and one of the top reflecting layer and the bottom reflecting layer may be formed by one of the metallization layers.

In further embodiments, at least one of the top reflecting layer and the bottom reflecting layer comprises a sequence of dielectric layers, which may in particular form a Bragg mirror.

In further embodiments, the semiconductor layer is an epitaxial layer, which may in particular be grown on a silicon-on-insulator substrate comprising a buried oxide layer. One of the top reflecting layer and the bottom reflecting layer may be arranged in the buried oxide layer. In further embodiments, the semiconductor layer is a photosensitive layer composed of quantum dots, amorphous silicon, organic photodetecting layers, or another thin photoconversion layer located above a readout IC. In each pixel, a small connection may be formed between the photosensitive layer and the readout IC.

BRIEF DESCRIPTION OF THE DRAWINGS

The following is a detailed description of examples of the semiconductor image sensor device in conjunction with the appended figures.

DETAILED DESCRIPTION

In the following description, the charge carrier generating component CG is represented by a photodiode, by way of example. The charge carriers may be transferred to a sense node SN through a transfer gate TX.

Figure 1:
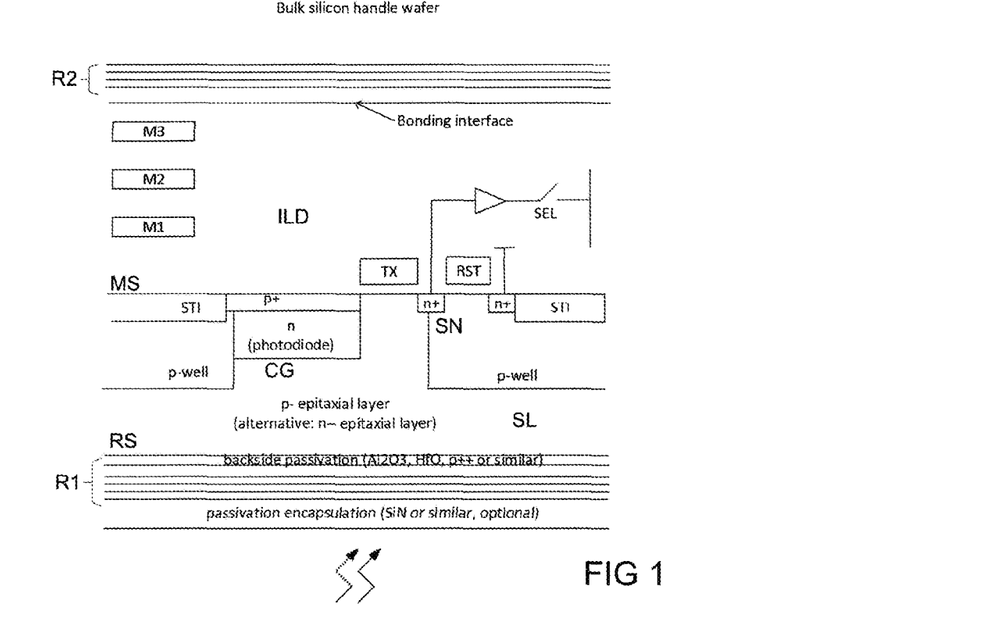
FIG. 1 is a partial cross section of a back-illuminated image sensor comprising a resonant cavity between dielectric reflecting layers.

FIG. 1 shows a back-illuminated image sensor, which may be a CMOS image sensor. Light enters from the rear side RS of the semiconductor layer SL, which may be silicon, for instance. The semiconductor layer SL may especially be an epitaxial layer of p-type or n-type conductivity. The reflecting layers R1, R2 are arranged above the rear side RS as a top mirror or top reflecting layer R1 and above the active part of the image sensor, which is represented by a photodiode, as a bottom mirror or bottom reflecting layer R2. The reflecting layers R1, R2 form opposite boundaries of a resonant cavity. The distance between the reflecting layers R1, R2 is tuned to obtain a desired resonance. The reflectance may typically be tuned to 940 nm, for example.

Inside the cavity the entire image sensor pixel array and readout circuits may be located. In other embodiments, using wafer-to-wafer, die-to-wafer or die-to-die stacking, the readout circuit can be part of a second wafer. The resonance produces a standing wave, which can be optimized by tuning the thicknesses of the layers to generate electrons inside the photodiode depletion layer.

The structure of the photodiode and the pixel may correspond to a conventional pixel structure. In FIG. 1, a pinned photodiode is shown, which comprises an n-type implant in a p-epitaxial layer. The diode is pinned by a p+ surface layer to keep the dark current low, and to ensure that the diode depletes at a low potential. The latter enables full in-pixel charge transfer to the floating diffusion sense node SN, which is shown as an n+ area at the right side of the photodiode, and accessed via the transfer gate TX.

The pixel may further comprise a shallow trench isolation STI, which may be passivated by a p-type implant, and additional transistors to reset the floating diffusion and to read out the floating diffusion (typically by a source follower). If small pixels are desired, some of these structures may be shared between different pixels. In some other pixels, additional structures may be present to enable additional functions, such as, for example, global shutter. Deep trench isolation may be present to avoid carrier diffusion to neighbor pixels. Such deep trenches are typically located at the surroundings of each pixel or around the perimeter of each photodiode. Deep trenches may or may not be through the entire silicon epitaxial layer. Deep trenches may be etched from the backside or the frontside and may be filled with oxide or any other material.

The top reflecting layer R1 can be made by a dichroic mirror (Bragg reflector), for example, as shown in FIG. 1. The bottom reflecting layer R2 can be formed in the same way. The reflecting layers R1, R2 are tuned for optimal reflectance at the target wavelength. The reflectance is tuned depending on the expected thickness of the layers between the two mirrors. In the embodiment according to FIG. 1, these layers include the semiconductor layer SL and the interlayer dielectric ILD. The latter may be typically $SiO_2$. Further layers may be present. For example, the surface at the backside of the detector, where the light enters, may be passivated by a dielectric with fixed negative charges. The passivation may comprise SiN or a similar material. A further passivation, in particular a layer comprising $Al_2O_3$, HfO, highly p-doped semiconductor material or the like, may be arranged between the top reflecting layer R1 and the semiconductor layer SL.

The process of manufacturing such a device structure differs from the standard manufacturing flow by the addition of the two reflecting layers R1, R2. The basic process flow is as follows: The CMOS image sensor wafer is processed in a standard CMOS image sensor process on bulk material that includes an epitaxial p− layer at its surface, on which the devices are formed. This p− epitaxial semiconductor layer is epitaxially grown on the substrate, so that the desired thickness is achieved at the end of the process. Processing of all CMOS and photodiode devices and interconnect layers occurs on this wafer in a standard CMOS wafer fab. The wafer is finished with a planarized oxide to prepare it for wafer-to-wafer molecular bonding.

The bottom reflecting layer R2, which may be a dielectric mirror, is applied on a handling wafer, which is optionally finished with a planarized oxide layer to prepare it for wafer bonding. The bottom reflecting layer R2 may instead be deposited on top of the CMOS image sensor prior to wafer bonding. The bottom reflecting layer R2 may as well be part of the interlayer dielectric ILD (e.g. a metal layer M1 of a wiring, or a dedicated reflecting layer arranged closer to the silicon). The benefit of this is that thickness variations of the interlayer dielectric ILD over the wafer are less critical for the optimization of the device structure. Then wafer-to-wafer oxide-oxide bonding is performed, possibly plasma activated. The wafer is thinned by grinding and etching of the substrate under the epitaxial layer until the desired thickness is achieved, which may be 2 to 3 microns, for instance.

The top reflecting layer R1 is then deposited. An additional layer (e.g. $SiO_2$) may be deposited to make sure that the resonance occurs at the targeted wavelength. The thickness of the layers may be optically measured so that the thickness of this additional layer can be tuned for resonance at the targeted wavelength. In this way, thickness variations that may occur during the process steps may be compensated. Bondpads are opened by a backside etch through the active device to the lower metallization layer M1, or by forming a through-substrate via (TSV) through the handle wafer connecting to the upper metallization layer M3. Wafer testing, dicing and assembly may follow, as in conventional process flows for CMOS image sensors.

A silicon-on-insulator (SOI) wafer may be used instead as start material for the CMOS processing. This SOI wafer contains a buried oxide layer, on top of which the epitaxial p− layer is grown. The benefit from SOI is improved thickness uniformity control during the backside thinning process.

In case of SOI, the etching can reach down to the buried oxide layer. In a subsequent process step, the buried oxide layer can be removed. A backside passivation is optionally deposited, which may be $Al_2O_3$ or HfO, for instance, or a p+ surface implant followed by a shallow anneal (e.g. by an eximer laser anneal).

Alternatively, the buried oxide layer of the SOI wafer is provided with the top reflecting layer R1 and is maintained. In this case a backside passivation should be applied to reduce the dark current, for example by a pre-existing p+ layer close to the buried oxide, present before CMOS processing.

The reflectance of the reflecting layers R1, R2 can be optimized for the designed thickness of the structure. The desired angular sensitivity and the selectivity to the target wavelength may also be taken account of. Reflectances of the reflecting layers R1 and R2 may also be adjusted to adjust the full width half maximum of the spectral response to the targeted value. Reflectances of the reflecting layers R1 and R2 may also be adjusted to optimize for an expected thickness variation of the resonating cavity that occurs with the processing, and to ensure that within the thickness tolerances, a sufficiently high response is achieved at the target wavelength. When tighter tolerances on thickness of the detector can be realized, higher reflectances can be used, which make the detectors more selective to the target wavelength, resulting in a smaller full width half maximum (FWHM) of the spectral response, and a higher response and quantum efficiency at the target wavelength. However, the photodetectors will also be more selective to the angle-of-incidence of the light.

Figure 2:
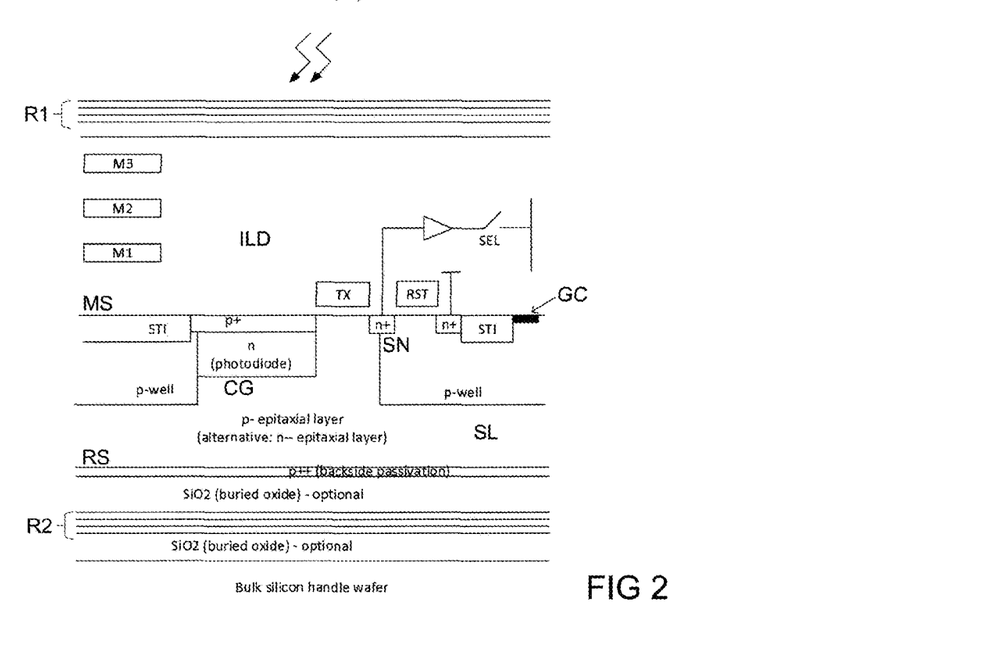
FIG. 2 is a partial cross section of a front-illuminated image sensor comprising a resonant cavity between dielectric reflecting layers.

FIG. 2 shows a front-illuminated image sensor. This image sensor can be manufactured on an SOI start wafer, in which the bottom reflecting layer R2 may already be embedded in the buried oxide layer. An epitaxial layer of the desired thickness is grown on the SOI wafer. Then an image sensor wafer is processed in a standard CMOS image sensor process. At the end of the processing, the top reflecting layer R1 is deposited prior to bondpad opening. A local gettering centre GC may be provided, as shown in FIG. 2. This gettering centre GC collects impurities that occur during CMOS processing. In standard p− epi on p++ bulk wafers, a gettering centre is usually present at the bottom of the wafer in the p++ bulk. With this SOI wafers, the buried oxide layer forms a barrier for diffusion of certain of these impurities, and they need to be collected at other locations in the pixel.

Figure 3:
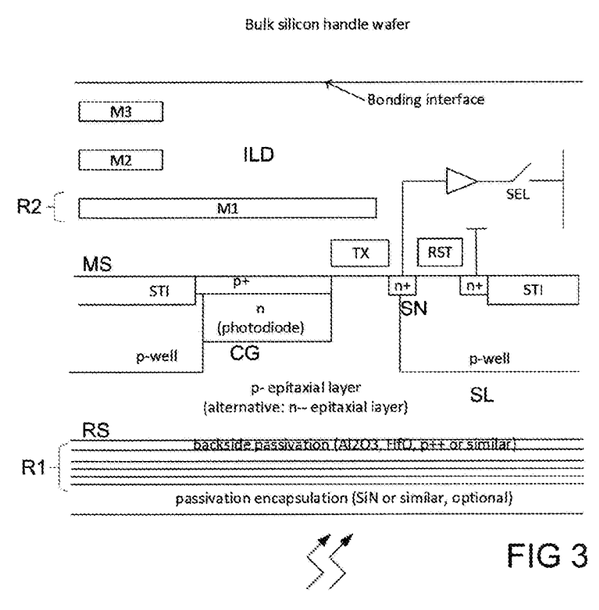
FIG. 3 is a partial cross section of a back-illuminated image sensor comprising a resonant cavity between a dielectric reflecting layer and a metal reflecting layer.

FIG. 3 shows a further back-illuminated image sensor. In this example, the bottom reflecting layer R2 is formed in a metal layer M1 of the metallization layers M1, M2, M3 that are embedded in the interlayer dielectric ILD. Such layer could be Al, Cu. The Al or Cu metal may be encapsulated by TiO, SiN or similar. The bottom reflecting layer R2 may also be a dedicated layer located closer to the silicon, such as a tungsten layer, for instance. Such tungsten layer is typically used as a light shield for interline transfer CCDs and some global shutter CIS sensors. It could be used in this case as reflector. The advantage of locating the bottom reflecting layer R2 inside the ILD stack or closer to the silicon, as shown in FIG. 3, is that thickness variations of the interlayer dielectric ILD may be neglected. In this structure, the characteristics of the etalon (such as peak quantum efficiency, FWHM, etalon finesse, angular sensitivity and tolerance to thickness variations) are mainly adapted by means of the adjustment of the reflectance of the top reflecting layer R1, and by adjustments of the dielectric between the top reflecting layer R1 and the backside passivation layer.

Figure 4:
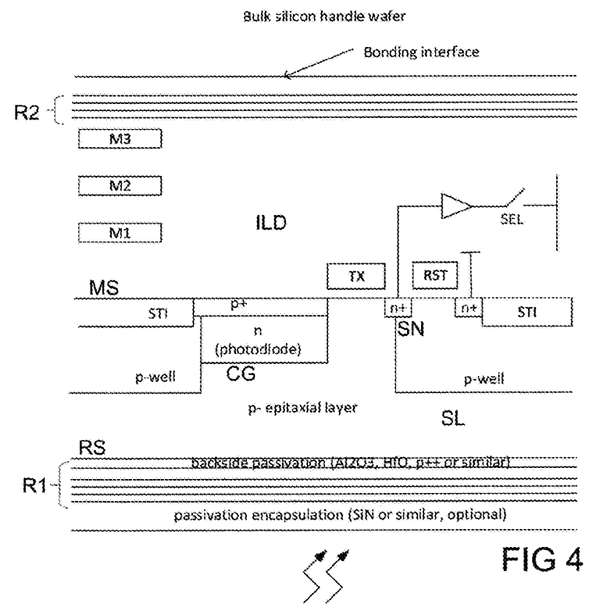
FIG. 4 is a partial cross section according to FIG. 1, indicating a different position of a bonding interface.

FIG. 4 shows a further back-illuminated image sensor similar to the image sensor according to FIG. 1. In the image sensor according to FIG. 1, the bonding interface is located between the metal stack and the bottom reflecting layer R2, which may in this case be provided on the handling wafer before bonding. In the image sensor according to FIG. 4, the bonding interface is instead located between the bottom reflecting layer R2 and the handling wafer. The advantage of this implementation is that variations in optical path length due to bonding interface issues (like voids) do not influence the optical behavior of the structure.

Figure 5:
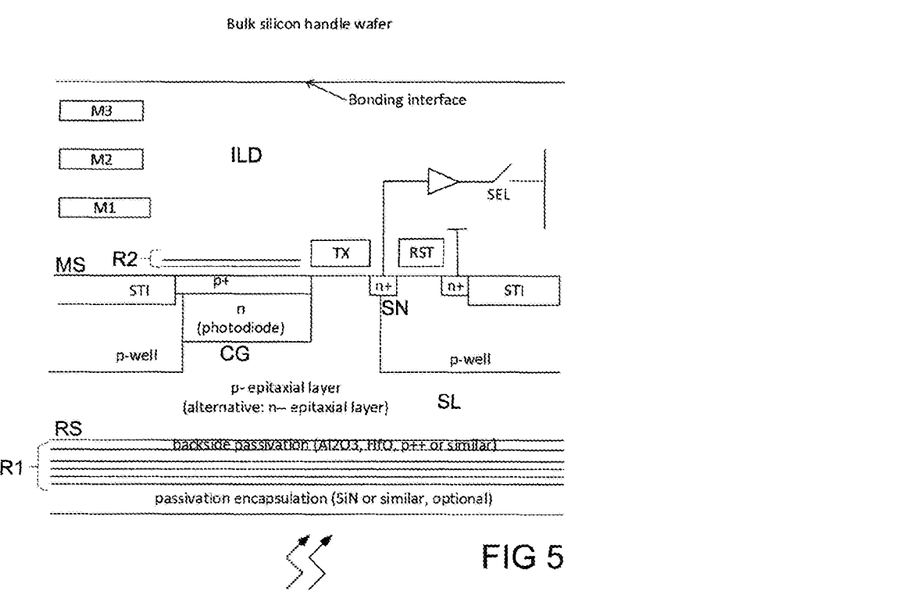
FIG. 5 is a partial cross section of a further back-illuminated image sensor comprising a resonant cavity between dielectric reflecting layers.

FIG. 5 shows a further back-illuminated image sensor. In the example of FIG. 5, the bottom reflecting layer R2 is formed by a dedicated dichroic reflector arranged above the photodiode. The bottom reflecting layer R2 can thus be arranged in the vicinity of the photodiode. In this example, a dedicated dielectric Bragg mirror is arranged near the bottom of the interlayer dielectric ILD, close to the semiconductor layer SL. If such a mirror is used for each pixel of an array, each of the pixels can be tuned individually, thus allowing to obtain different spectral characteristics for different pixels.

Figure 6:
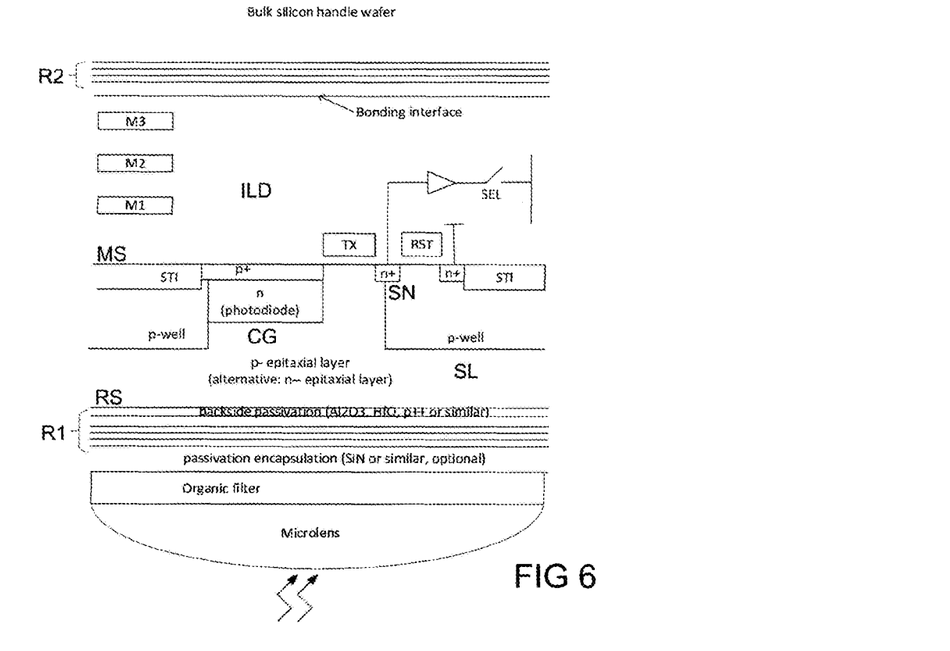
FIG. 6 is a partial cross section of a back-illuminated image sensor comprising a resonant cavity between dielectric reflecting layers and additional optical components.

FIG. 6 shows a further back-illuminated image sensor with a microlens and an additional filter, which can be applied independently of one another. The additional filter may be an organic filter, for instance. It may be provided to filter harmonics of the resonating structure. Color filters could be of use to further suppress out-of-band light. Microlenses may improve the sensitivity, depending on the tolerance with respect to the angle of incidence for which the structure is designed.

Figure 7:
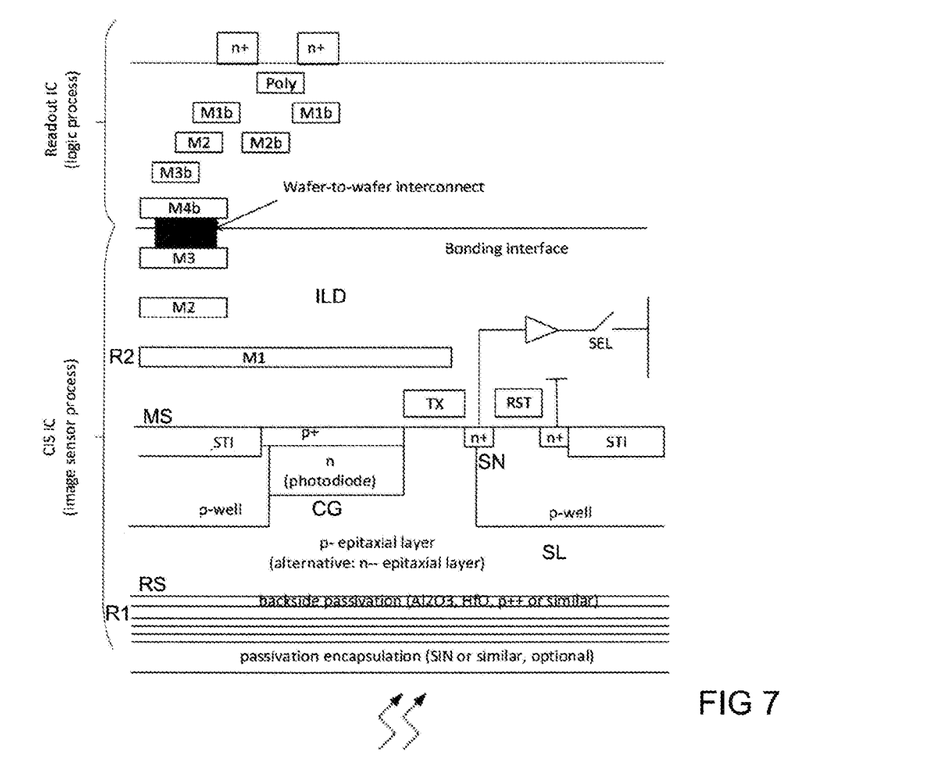
FIG. 7 is a partial cross section of a wafer stacked image sensor including a back-illuminated image sensor according to FIG. 3.

FIG. 7 shows an example similar to FIG. 3 with a stacked further wafer. In the example of FIG. 7, the top of the image sensor wafer is not bonded to a handle wafer, but to a logic wafer. The bonding can be effected by wafer-to-wafer interconnects. Such a technology of vertical integration is known per se and need not be described in detail. Various wafer-to-wafer connection schemes may be employed. The electric connection shown in FIG. 7 can be produced by direct bonding between metal vias (formed in metal layers M3 and M4b in this example).

In the example shown in FIG. 7, the top reflecting layer R1 is formed in the metal layer M1, and the bottom reflecting layer R2 is a dichroic reflector at the backside surface. The reflecting layer R1, R2 can instead be formed as in the embodiments according to FIG. 1, 2, 4, 5 or 6.

Figure 10:
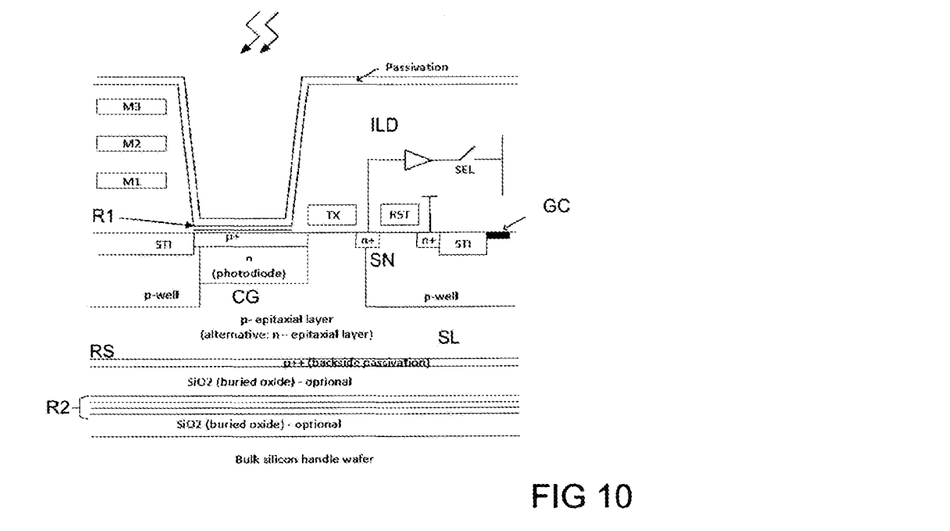
FIG. 10 is a partial cross section of a front-illuminated image sensor similar to FIG. 2, further comprising a back-etched opening above the photodiode in the interlayer dielectric and a frontside reflecting mirror above the photodiode.

The image sensor can be processed on a thin silicon layer on an SOI wafer (where the SOI may already include one of the reflectors as described earlier or may not yet include a reflector). Thus the thickness of an active device wafer can be less than a few times the effective wavelength of light in silicon (λ/n) at the target wavelength. Assuming 950 nm and a refractive index of 3.5 at 950 nm for silicon, for example, this means a thickness of λ/n=271 nm or a small multiple of this value. A thinner implementation may be more tolerant to wafer thickness variations and to variations in angle-of-incidence of the incident light. Thicknesses of 2λ/n, 3λ/n or 4λ/n may be needed for proper operation of the transistor devices (e.g. n-well and p-well implants). The thicknesses realized in such way could be substantially thinner than the ones employed on traditional image sensors for near-infrared imaging. The structure is similar to FIG. 2 but the epi layer will be a few 100 nm thin only. Possibly, a cavity may be etched above the photodiode to eliminate the thickness of the ILD dielectric. Such structure is shown in FIG. 10. Etching back the dielectric above photodiodes is commonly known in the art. FIG. 10 shows the presence of an additional reflector above the photodiode. This reflector may be any of the types mentioned earlier, or a Bragg mirror or a thin metal sheet.

Some embodiments may be optimized for thin silicon thicknesses, as this also enables to improve carrier collection time and to improve the time response of the pixels. Other embodiments may be optimized only for high quantum efficiency at the target wavelength, and in this case thicker detectors may be usable.

Thickness control is critical to tune the structure to the target wavelength. Worst case variations within a wafer of an epitaxial layer grown on an SOI wafer with a seed silicon layer (which may be p+ pre-doped) are typically 4% of the thickness of the epitaxial layer grown on that SOI wafer. For back-illuminated image sensors, worst case variations are typically around 4% of the thickness of the active substrate after thinning. A thinner active layer in the resonating cavity may be beneficial for a larger tolerance to thickness variations because 1) at lower harmonic order the variation of thickness is less critical; 2) control of thickness may be easier, in particular for front-illuminated image sensors comprising an epitaxial layer grown on top of an SOI wafer.

Figure 8:
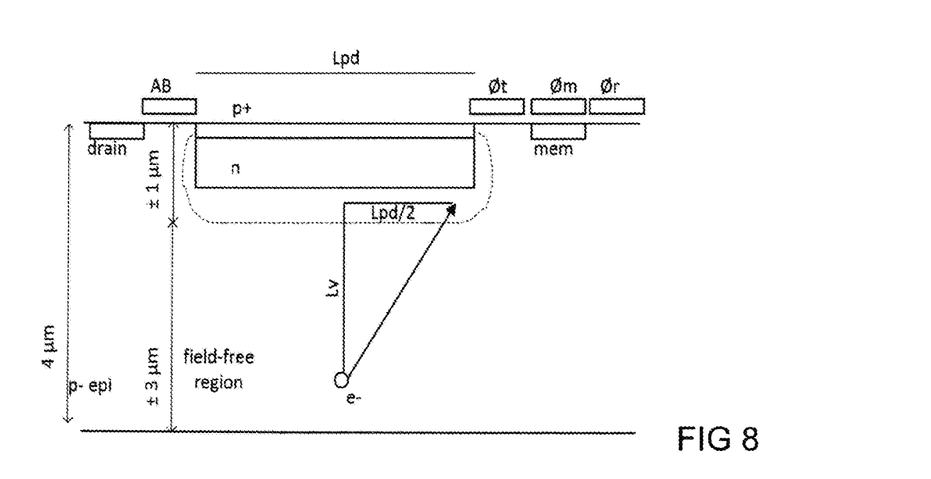
FIG. 8 illustrates the diffusion path of the charge carriers in the image sensor.

FIG. 8 shows a structure to illustrate the carrier collection path for collection of carriers. The vertical diffusion distance for a carrier generated inside the silicon to the photodiode is Lv. The total diffusion distance Lp to the memory is Lp=sqrt{Lv$^2$+(Lpd/2)$^2$}. In time-of-flight pixels, carriers are collected in a memory node mem as shown by means of example under a memory gate. The diffusion distance to that memory is the aforementioned total diffusion distance Lp.

Figure 9:
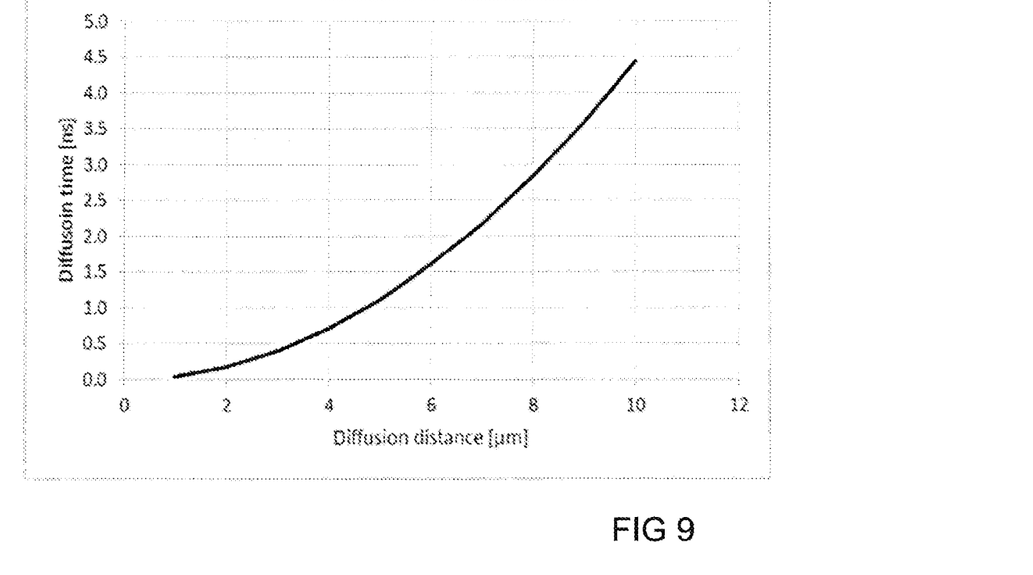
FIG. 9 illustrates the diffusion time of a photocarrier before it is collected.

FIG. 9 shows the time it takes for carriers to diffuse over a certain distance in this structure in function of the photodiode length Lpd in the absence of an electric field. The time is significant, and becomes above 1 ns for a diffusion path of 5 μm. The present embodiment brings this to much lower values, as the structure can be designed such that carriers will be mostly generated inside the depletion region of the photodiode (so Lv in the formula above is significantly smaller). No diffusion is required for collection of charges in the photodiode. To allow a fast transfer of charges to the memory, a small photodiode can be used, minimizing the Lpd distance. Some applications like time-of-flight 3D imaging and fast time gating require fast collecting of photoelectrically generated carriers, which may require diffusion times below 1 ns (nanosecond). With too high diffusion times, photocharges risk to be mixed and appear in the wrong charge collection bin. This reduces the so-called modulation contrast. The present embodiment keeps this modulation contrast high due to the short diffusion distance.

FIG. 10 is a partial cross section of a further front-illuminated image sensor. The embodiment according to FIG. 10 comprises a back-etched opening above the photodiode in the interlayer dielectric ILD. The top reflecting layer R1 is arranged above the charge carrier generating component CG.

Figure 11:
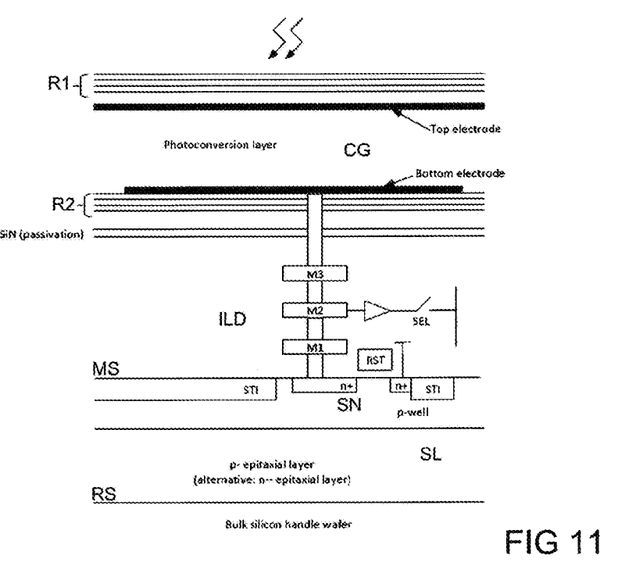
FIG. 11 is a partial cross section of a front illuminated image sensor comprising a resonant cavity in a dedicated photoconversion layer connected to a readout circuit in an underlying CMOS layer.

FIG. 11 shows another partial cross section of a front illuminated image sensor comprising a resonant cavity in a dedicated photoconversion layer connected to a readout circuit in an underlying CMOS layer. Such dedicated photon conversion layer could be a quantum film layer as, for example, described in US 2009/0152664 A1. Other embodiments could be an organic photosensitive film or an amorphous or crystalline silicon film, or a film composed of III-V materials, for example for IR sensing in the SWIR band or other wavelength band, or any other form of photoconversion layer. Such conversion layers typically feature a top contact, which is transparent (e.g. indium tin oxide) and which is biased to a certain bias voltage, and common for all pixels. And such conversion layers typically feature a bottom contact which is separate per pixel. Top and bottom contacts are optimized to work together with the photoconversion film. The resonating cavity is created by optimizing the reflectances and by tuning the thickness of the cavity for the target wavelength. The top and bottom electrodes may be part of the reflecting mirror design or may be part of the optical transmittive layers in the resonating cavity. The resonating cavity is expected to further increase the photon absorption and quantum efficiency in this structure. The bottom electrode is connected to a readout circuit. One example is shown in the drawing, where the film is connected by a connection to a junction and a reset switch, and the input of a buffer amplifier such as a source follower. Other configurations could be used, such as a charge sense amplifier as commonly known in the art.

Figure 12:
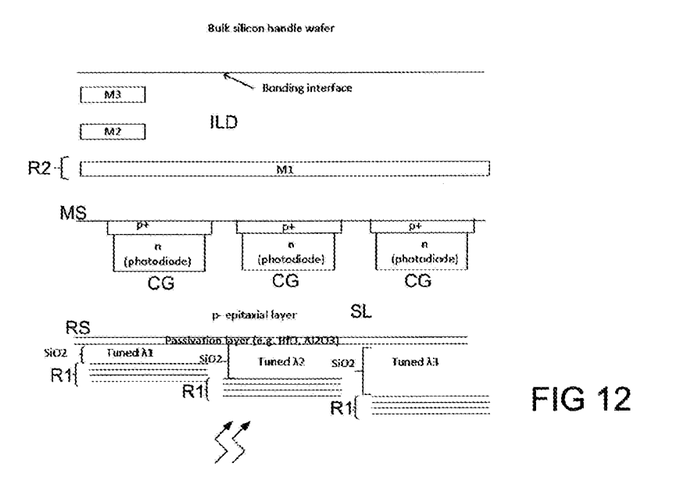
FIG. 12 is a partial cross section of a set of pixels, each tuned to different wavelength bands, in order to create a multi-spectral or hyper-spectral 2D or linear image sensor.

FIG. 12 shows an embodiment wherein different pixels are tuned for different resonating wavelengths. This allows to construct 2D pixel arrays or a linear (linescan) pixel image sensor where different pixels are optimized for different wavelengths, resulting in a multi-spectral or hyperspectral device.

Figure 13:
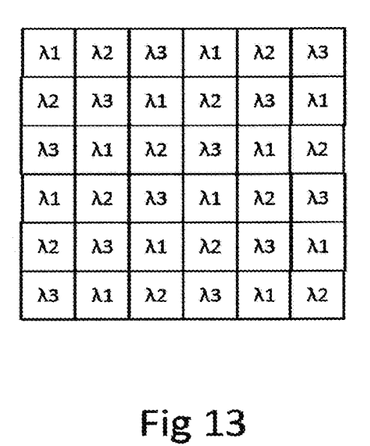
FIG. 13 shows a top view of a multi-spectral pixel array using pixels with resonating cavities optimized for different wavelengths.

FIG. 13 shows an example of such a pixel arrangement for three different wavelengths $\lambda_1$, $\lambda_2$ and $\lambda_3$. The number of wavelengths is arbitrary. The arrangement is formed by adjusting the optical path for different pixels differently. One way to do this is by patterning and depositing additional SiO$_2$ dielectric layers at the top of the pixel as shown in FIG. 12. This can be done by commonly known processing techniques for CMOS wafer processing. Conventional hyperspectral and multispectral sensors use Fabri-Pérot interferometers on top of the pixels, for example (cf. N. Tack et al., "A Compact High Speed and Low Cost Hyperspectral Imager", proc. SPIE Vol. 8266, 2012), or classical absorbing color filters. The advantage of the current embodiment is that much higher quantum efficiencies can be achieved at the target wavelengths, and that thin detector layers can be employed, as described above.

Figure 14:
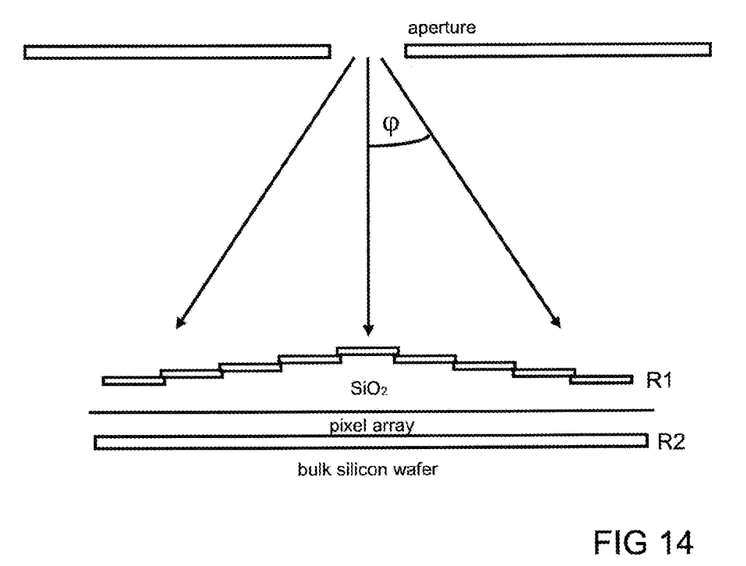
FIG. 14 is a partial crosssection of a camera module, showing the aperture and the concept of tuning the thickness of the resonating cavity to the chief ray angle.

FIG. 14 shows conceptually a cross-section of a camera module. The incident radiation is represented by arrows. The chief ray angle varies between 0 degrees and a larger angle, e.g. 20 degrees, depending on the characteristics of the camera lens. This shift will cause a shift of the resonating wavelength of the structure. This may not be desired. In order to compensate for this, a telecentric lens can be designed but this may increase thickness of the camera module. A different solution is shown in FIG. 14, where the thickness of the cavity is adjusted accordingly for the pixel position in the pixel array. At the centre, the thickness is thicker than at the outer areas of the pixel array, in accordance to the chief ray angle distribution over the pixel array and such that the resonating wavelength stays constant. Ideally, it is ensured that the product d·cos(φ) remains fixed. This may be approximated by a step function, in order to reduce the wavelength shift to the minimum possible. Such staircase pattern may be realized by selective oxide deposition or oxide etch steps, which may be masked by successive lithography steps as commonly used in semiconductor manufacturing.

FIGS. 15 to 19 show stages of a manufacturing method for the image sensor. Details of the internal structure of the image sensor may vary among different embodiments and are only schematically indicated.

Figure 15:
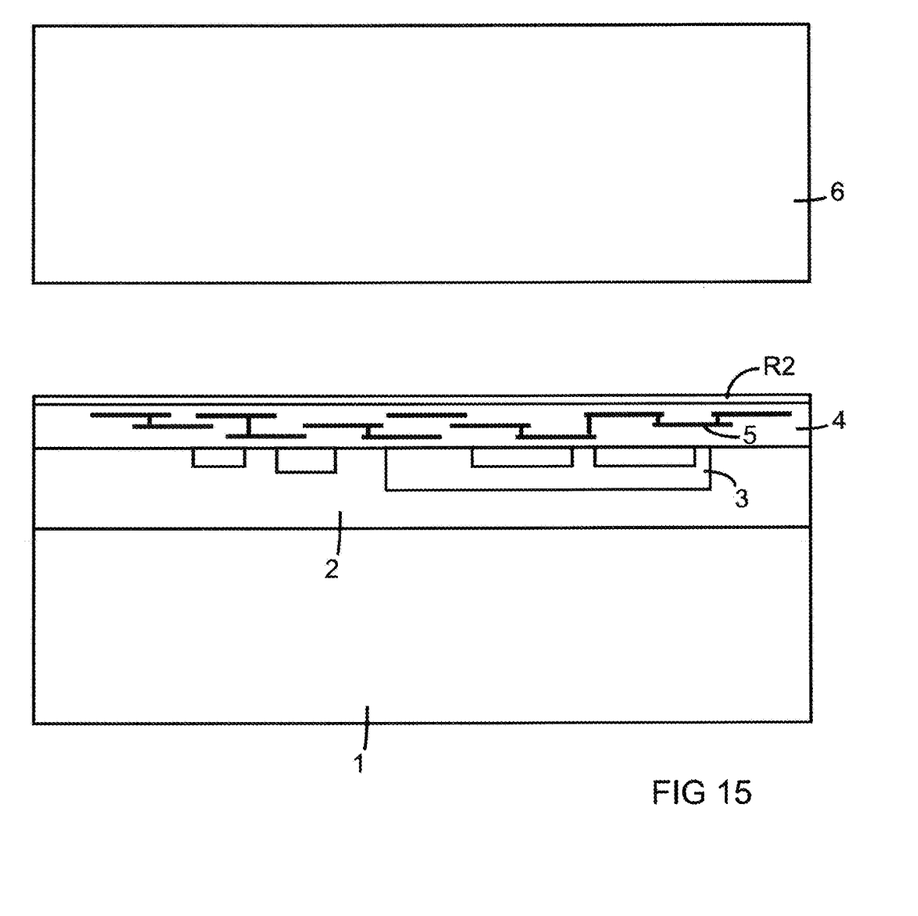
FIG. 15 shows a first stage of a manufacturing method for the image sensor after the formation of the bottom reflecting layer.

FIG. 15 shows a cross section of a bulk wafer 1 with an epitaxial layer 2 of semiconductor material. Components of an integrated circuit 3, including a charge carrier generating component like a photodiode, are formed in the epitaxial layer 2. An interlayer dielectric 4 and a wiring 5 comprising metallization layers and interconnections, which are embedded in the interlayer dielectric 4, are arranged above the epitaxial layer 2. The bottom reflecting layer R2 is applied on the interlayer dielectric 4. FIG. 15 also shows a further wafer 6, which is bonded to the bottom reflecting layer R2. The further wafer 6 may be a handle wafer, for instance.

Figure 16:
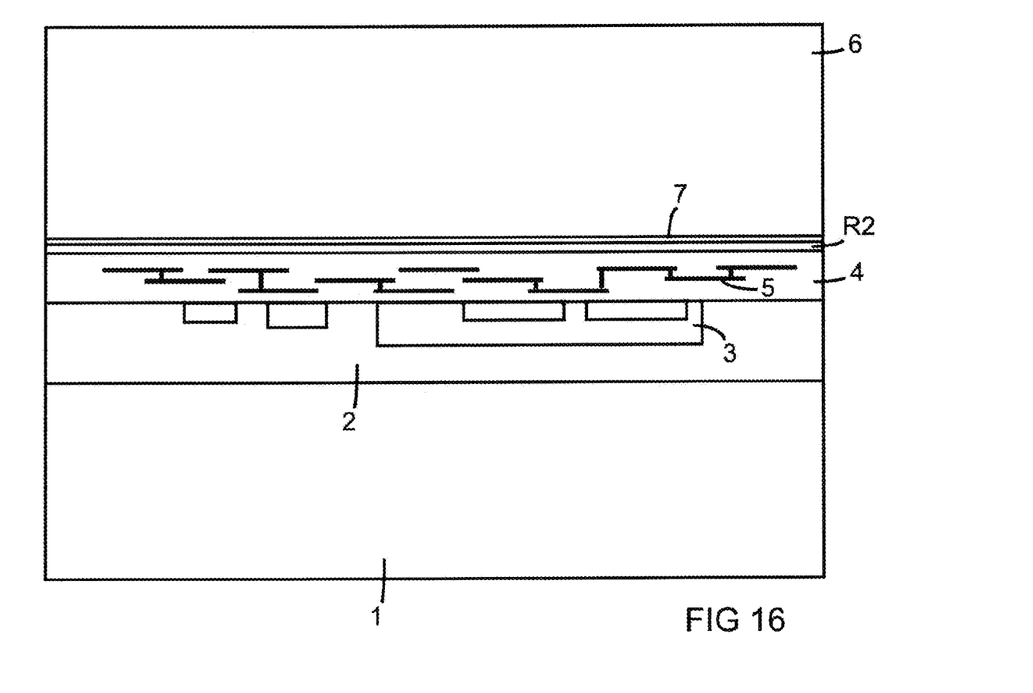
FIG. 16 shows a further stage of the manufacturing method after a handle wafer is bonded.

FIG. 16 shows a cross section according to FIG. 15 after the further wafer 6 is bonded. A dedicated bonding layer 7, which may be an oxide layer, in particular SiO$_2$, may be provided for this purpose. The bulk wafer 1 is then removed, which can be done by grinding and/or etching, for instance.

Figure 17:
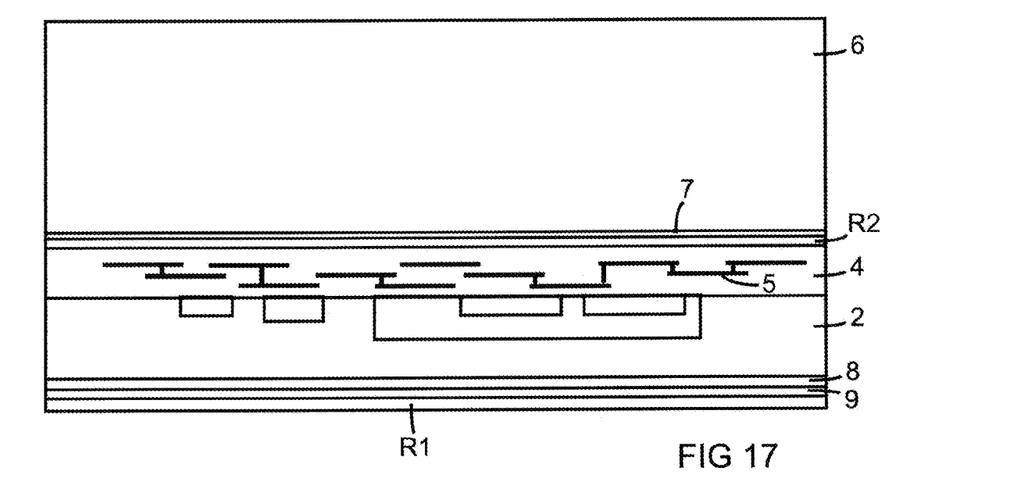
FIG. 17 shows a further stage of the manufacturing method after the formation of the top reflecting layer.

FIG. 17 shows a cross section according to FIG. 16 after the bulk wafer 1 is removed. A passivation layer 8 can then be applied on the back surface of the epitaxial layer 2. A dielectric layer 9 may be applied before the top reflecting layer R1 is applied.

Figure 18:
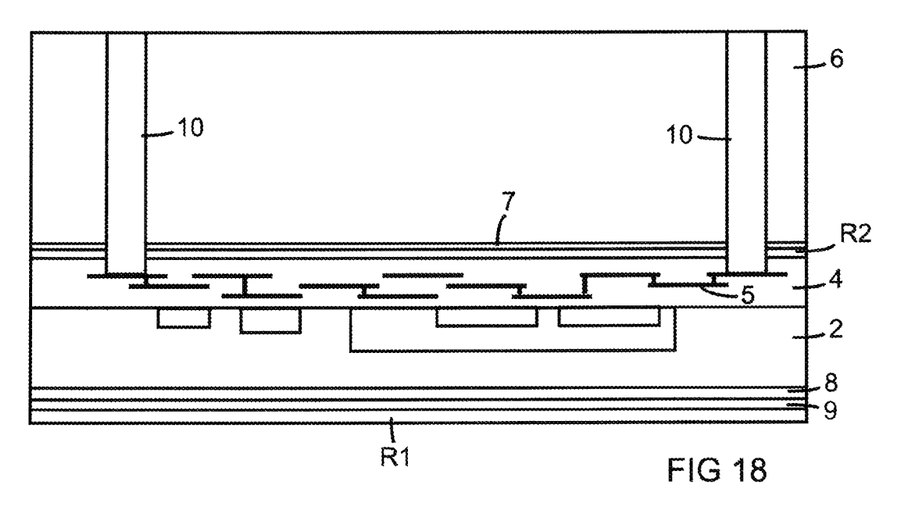
FIG. 18 shows a further stage of the manufacturing method after the formation of through-substrate vias.

FIG. 18 shows a cross section according to FIG. 17 after the formation of through-substrate vias 10 in the further wafer 6, which forms part of the device. The through-substrate vias 10 are partially or completely filled with an electrically conductive material and form contacts on contact areas of the wiring 5.

Figure 19:
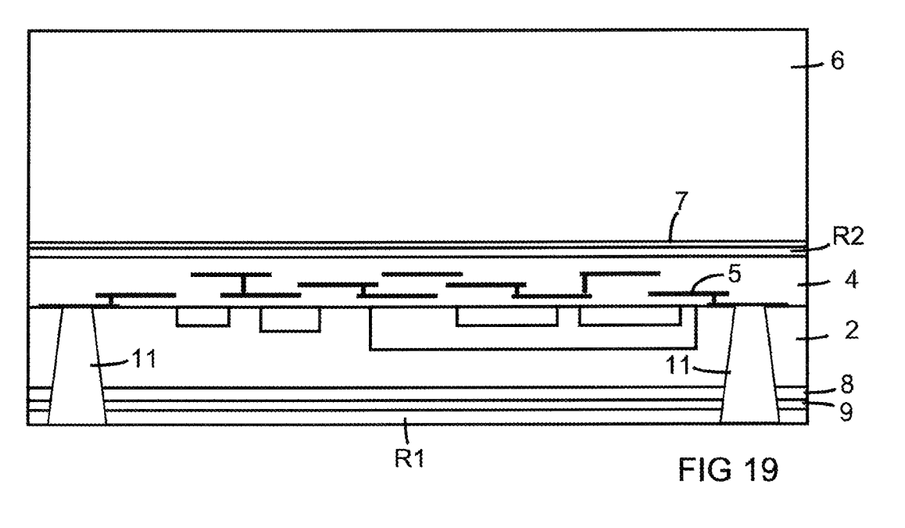
FIG. 19 shows a further stage of the manufacturing method after the formation of openings above contact pads.

FIG. 19 shows a cross section according to FIG. 17 after the formation of openings 11 in the epitaxial layer 2. Contact areas of the wiring 5 or contact pads are thus uncovered. Electric connections to the contact areas or pads can then be formed by applying electrically conductive material, in particular further metallization layers or bond wires, in the openings 11.

The described embodiment allows very high quantum efficiency at wavelengths in near-infrared for silicon (or in general, where the photon has little excess energy over the bandgap energy), the use of a thin structure with little to no crosstalk to neighbouring pixels, thus allowing small pixel pitches, the use of conventional pinned photodiode and transfer gate structures allowing low read noise and low dark current, and very fast carrier collection, in particular for time-of-flight pixels and fast gating pixels. Furthermore, the manufacturing is compatible with standard manufacturing flows for CMOS image sensors and allows mass-manufacturing with good repeatability. The structure can withstand the same environmental conditions as standard CMOS image sensors.

The invention claimed is:

1. A semiconductor image sensor device, comprising:
    a semiconductor layer having a main surface and an opposite rear surface, and
    a charge carrier generating component at the main surface, the charge carrier generating component being sensitive to radiation,
    wherein
    the semiconductor layer is an epitaxial layer that is grown on a silicon-on-insulator substrate comprising a buried oxide layer,
    the charge carrier generating component is arranged between a top reflecting layer and a bottom reflecting layer,
    the top reflecting layer and the bottom reflecting layer form opposite boundaries of a resonant cavity, which is tuned to a target wavelength, and
    the top reflecting layer and the bottom reflecting layer are arranged outside the semiconductor layer.

2. The semiconductor image sensor device according to claim 1, wherein
    the top reflecting layer is provided for incidence of radiation and is arranged above the main surface, and
    the bottom reflecting layer is arranged below the rear surface.

3. The semiconductor image sensor device according to claim 1, wherein
    the top reflecting layer is provided for incidence of radiation and is arranged above the rear surface, and
    the bottom reflecting layer is arranged below the main surface.

4. The semiconductor image sensor device according to claim 1, further comprising:
    a photodiode forming the charge carrier generating component,
    a region of a first conductivity type in the semiconductor layer at the main surface,
    a region of a second conductivity type, which is opposite to the first conductivity type, the region of the second conductivity type being contiguous with the region of the first conductivity type, thus forming the photodiode,
    a sense node at or near the main surface, and
    a transfer gate at the main surface between the photodiode and the sense node.

5. The semiconductor image sensor device according to claim 1, further comprising:
    a dielectric layer on or above the main surface,
    the dielectric layer being arranged between the semiconductor layer and the top reflecting layer, and
    the top reflecting layer being provided for incidence of radiation.

6. The semiconductor image sensor device according to claim 1, further comprising:
    a dielectric layer on or above the main surface, the dielectric layer being arranged between the semiconductor layer and the bottom reflecting layer, and
    the top reflecting layer being provided for incidence of radiation.

7. The semiconductor image sensor device according to claim 1, further comprising:
    a dielectric layer on or above the main surface,
    one of the top reflecting layer and the bottom reflecting layer being embedded in the dielectric layer, and
    the top reflecting layer being provided for incidence of radiation.

8. The semiconductor image sensor device according to claim 5, further comprising:
  metallization layers embedded in the dielectric layer,
  one of the top reflecting layer and the bottom reflecting layer being formed by one of the metallization layers, and
  the top reflecting layer being provided for incidence of radiation.

9. The semiconductor image sensor device according to claim 1, wherein
  at least one of the top reflecting layer and the bottom reflecting layer comprises a sequence of dielectric layers.

10. The semiconductor image sensor device of claim 9, wherein the sequence of dielectric layers forms a Bragg mirror.

11. The semiconductor image sensor device according to claim 1, wherein
  the top reflecting layer and the bottom reflecting layer form opposite boundaries of a resonant cavity, which is tuned to a wavelength of infrared radiation.

12. The semiconductor image sensor device according to claim 1, wherein
  the top reflecting layer and the bottom reflecting layer form opposite boundaries of a resonant cavity, which is tuned to a wavelength within the range from 900 nm to 980 nm.

13. The semiconductor image sensor device of claim 1, wherein
  one of the top reflecting layer and the bottom reflecting layer is arranged in the buried oxide layer.

14. A semiconductor image sensor device, comprising:
  a semiconductor layer having a main surface and an opposite rear surface, and
  a charge carrier generating component at the main surface, the charge carrier generating component being sensitive to radiation, wherein the charge carrier generating component is formed by a photodiode, wherein a region of a first conductivity type is arranged in the semiconductor layer at the main surface, and a region of a second conductivity type, which is opposite to the first conductivity type, is contiguous with the region of the first conductivity type, thus forming the photodiode,
  a sense node at or near the main surface,
  a transfer gate at the main surface between the photodiode and the sense node,
  wherein:
  the charge carrier generating component is arranged between a top reflecting layer and a bottom reflecting layer,
  the top reflecting layer and the bottom reflecting layer form opposite boundaries of a resonant cavity, which is tuned to a target wavelength, and
  the top reflecting layer and the bottom reflecting layer are arranged outside the semiconductor layer.

* * * * *